United States Patent

Kattner et al.

[11] Patent Number: 6,163,207
[45] Date of Patent: Dec. 19, 2000

[54] INTEGRATOR-FILTER CIRCUIT

[75] Inventors: Axel Kattner, Seevetal; Holger Gehrt, Rosengarten, both of Germany

[73] Assignee: U.S. Philips Corporation, New York, N.Y.

[21] Appl. No.: 09/226,355

[22] Filed: Jan. 6, 1999

[30] Foreign Application Priority Data

Jan. 7, 1998 [DE] Germany .......................... 198 00 206

[51] Int. Cl.$^7$ ...................................................... H03H 5/00
[52] U.S. Cl. ........................................... 327/553; 327/551
[58] Field of Search ................................... 327/551, 552, 327/553, 336, 337

[56] References Cited

U.S. PATENT DOCUMENTS 5,200,716  4/1993  Amano .................................... 327/553
5,204,631  4/1993  Hobbs .................................... 327/553

*Primary Examiner*—Timothy P. Callahan
*Assistant Examiner*—An T Luu
*Attorney, Agent, or Firm*—Steven R. Biren

[57] ABSTRACT

For varying the filter frequencies in an integrator-filter circuit for filtering a push-pull signal by at least two integrator signal filters (31, 32, 33) having integrator elements (1), whose filter frequencies are adjustable by control currents ($I_{n,1}$, $I_{n,2}$) applied to the integrator elements (1), the integrator-filter circuit includes a reference integrator filter (38) having at least two integrator elements (1) constructed in an identical technique as the other integrator elements (1). This reference integrator filter, when tuned to the frequency of a test signal applied thereto, shifts the phase of the test signal by a defined value, and is arranged subsequent to a phase comparator (39) which also receives the test signal, so that a correction signal is derived from the output signal of the phase comparator (39), in dependence upon this correction signal. The control currents ($I_{n,1}$, $I_{n,2}$) applied to the integrator elements (1) of the reference integrator filter (38) and the integrator signal filters (31, 32, 33) are generated and in response to the control currents the reference integrator filter (38) is tuned to the frequency of the test signal applied thereto, in that the integrator signal filters (31, 32, 33) are tuned to rated frequencies in dependence upon the correction signal when the reference integrator filter (38) is tuned exclusively in response to the two control currents to a reference frequency test signal applied thereto. For tuning the integrator signal filters (31, 32, 33) at filter frequencies deviating by a predeterminable detuning value from the rated frequencies, at least a switching control current is superimposable on the control currents applied to the reference integrator filter (38), this switching control current being dimensioned in such a way that, when tuning the reference integrator filter (38) to the test signal by the correction signal, this test signal causes the integrator signal filters (31, 32, 33) to tune to frequencies which deviate by the detuning value from their rated frequencies.

14 Claims, 3 Drawing Sheets

INTEGRATOR-FILTER CIRCUIT

BACKGROUND OF THE INVENTION

1. Field of the Invention

The invention relates to an integrator-filter circuit for filtering a push-pull signal by means of at least two integrator signal filters comprising integrator elements, having filter frequencies adjustable by means of control currents applied to the integrator elements.

2. Description of the Related Art

In such integrator-filter circuits, which are known as such, for example, from the Philips IC TDA 9715, it is often desirable to change the filter frequencies of the integrator signal filters. For example, if the push-pull signal to be filtered is a video signal comprising a plurality of sound signals modulated on a plurality of sound carriers, these sound carriers may have different frequencies, dependent on the transmission standard. If the integrator signal filters of such an integrator-filter circuit are implemented for different sound carrier frequencies, the filter frequencies of these signal filters must be varied in dependence upon the frequencies of the sound carriers. The mutual distance between the sound carrier frequencies then mostly remains constant, but, for example, all filter frequencies must be shifted 1 MHz up or down. In state-of-the-art arrangements, this is done by adjusting the control currents applied to the integrator elements of the integrator signal filters accordingly. The control currents for the integrator elements are varied individually. This involves quite a considerable number of circuit components.

SUMMARY OF THE INVENTION

It is an object of the invention to improve the integrator-filter circuit described in the opening paragraph in such a way that such a variation of the filter frequencies is possible with a minimal number of circuit components.

In accordance with a first embodiment of the invention, this object is achieved in that the integrator-filter circuit comprises a reference integrator filter having at least two integrator elements constructed in an identical technique as the other integrator elements, this reference integrator filter, when tuned to the frequency of a test signal applied thereto, shifting the phase of said test signal by a defined value, and being is arranged subsequent to a phase comparator which also receives the test signal, in that a correction signal is derived from the output signal of the phase comparator, the control currents applied to the integrator elements of the reference integrator filter and the integrator signal filters being generated in dependence upon the correction signal, the reference integrator filter by means of the control currents, is tuned to the frequency of the test signal applied thereto, in that the integrator signal filters are tuned to rated frequencies in dependence upon the correction signal when the reference integrator filter is tuned to a reference frequency test signal applied thereto, and in that, for tuning the integrator signal filters to filter frequencies deviating by a predeterminable detuning value from the rated frequencies, a test signal deviating by the predeterminable detuning value from the reference frequency is applied to the reference integrator filter which is tuned to said test signal.

The integrator-filter circuit incorporates a reference integrator filter. Similarly as the integrator signal filters, this reference integrator filter comprises integrator elements. It is essential that these integrator elements are constructed in the same technique, i.e., with the same components and in the same circuitry. However, the reference integrator filter need not have the same filter order as the integrator signal filters, i.e., it need not comprise the same number of integrator elements. The circuitry of integrator elements within the reference integrator filter may also deviate from that within the integrator signal filter. However, the integrator elements as such should be constructed in the same technique.

The reference integrator filter is constructed in such a way that it shifts the phase of a test signal applied thereto and having a given, known frequency, by a defined value when the reference integrator filter is tuned to the frequency of this test signal. The reference integrator filter is also tuned by means of control currents which are applied to the integrator elements of this filter.

Furthermore, a phase comparator is provided which receives the signal to be filtered, this signal being unchanged as regards its phase position, and the output signal of the reference integrator filter, whose phase is shifted by 90 degrees when it is tuned to the frequency of the test signal.

Dependent on the phase relations of these two signals, the phase comparator supplies an output signal indicating this phase relation. A correction signal, dependent on which the control currents applied both to the integrator elements of the reference integrator filter and to the integrator elements of the integrator signal filters are generated, is derived from the output signal.

It is thereby achieved that the control currents applied to the reference integrator filter are controlled in dependence upon the correction signal and hence also in dependence upon the output signal of the phase comparator until the reference integrator filter is tuned to the frequency of the test signal. When this tuning has been achieved, the phase shift of the two input signals of the phase comparator is thus 90 degrees and the phase comparator supplies a corresponding output signal from which the correction signal is derived. The control currents which adjust the integrator elements of the reference integrator filter in such a way that the filter is exactly tuned to this frequency, are derived from this correction signal.

However, the control currents which are applied to the integrator elements of the integrator signal filter are also derived from the correction signal. Tuning of the reference integrator filter at the frequency of the test signal and the correction signal generated in dependence upon this tuning thus also has a corresponding influence on the control currents of the integrator elements of the integrator signal filters and hence on their tuning frequencies or filter frequencies.

The circuit may be implemented in such a way that the integrator signal filters are tuned to rated frequencies when the reference integrator filter is tuned to the frequency of the test signal. It is thus known, or selectable by way of a corresponding implementation of the circuit, to which frequencies the integrator signal filters are tuned when the reference integrator filter is correctly tuned to the frequency of the test signal applied thereto.

On the one hand, it has thereby been achieved that all integrator signal filters are tuned correctly when the reference integrator filter is tuned to the test signal.

On the other hand, this arrangement also allows the filter frequencies of the integrator signal filters to be jointly shifted up or down by a given, predeterminable detuning value. Thus, for example, all filter frequencies of the integrator signal filters may be shifted 1 MHz upwards. To this end, the frequency of the test signal applied to the reference integrator is changed by exactly this detuning value. For example, if the filter frequencies of the integrator signal filters are shifted 1 MHz upwards with respect to the rated frequencies, the frequency of the test signal applied to the reference integrator filter is also changed by exactly this value. Due to this change, the reference integrator filter must be tuned again, which results in a correction signal which has changed accordingly. Due to the changed correction signal, the control currents are also changed accordingly so that the reference integrator filter is tuned to the changed frequency of the test signal.

However, since the control currents of the integrator elements of the integrator signal filters are also derived from the correction signal, these control currents are also changed accordingly, so that the filter frequencies of the integrator signal filters are shifted by the same detuning value.

By generating the correction signal and the integrator signal filter control currents derived from this correction signal, it is thus achieved that tuning to new frequencies or detuning by the detuning value is realized jointly for all integrator signal filters. As compared with the solutions of the prior art, the number of circuit- technical components is already reduced when the reference integrator filter comprises fewer integrator elements than the integrator signal filters combined.

The object described above is further solved by means of a second embodiment of the invention which is characterized in that the integrator-filter circuit comprises a reference integrator filter having at least two integrator elements constructed in an identical technique as the other integrator elements, this reference integrator filter, when tuned to the frequency of a test signal applied thereto, shifting the phase of said test signal by a defined value, and being is arranged subsequent to a phase comparator which also receives the test signal, in that a correction signal is derived from the output signal of the phase comparator, in dependence upon the correction signal, the control currents applied to the integrator elements of the reference integrator filter and the integrator signal filters are generated, by means of the control currents, the reference integrator filter is tuned to the frequency of the test signal applied thereto, in that the integrator signal filters are tuned to rated frequencies in dependence upon the correction signal when the reference integrator filter is tuned exclusively by means of the two control currents to a reference frequency test signal applied thereto, and in that, for tuning the integrator signal filters at filter frequencies deviating by a predeterminable detuning value from the rated frequencies, at least a switching control current is superimposable on the control currents applied to the reference integrator filter, which switching control current is dimensioned in such a way that, when tuning the reference integrator filter to the test signal by means of the correction signal, this test signal causes the integrator signal filters to tune to frequencies which deviate by the detuning value from their rated frequencies.

The second embodiment of the invention is basically the same as the first embodiment. However, tuning of the integrator signal filters to frequencies deviating by the predeterminable detuning value from the rated frequencies is effected in a different way.

To adjust this detuning value of the filter frequencies of the integrator signal filters, the frequency of the test signal is not changed in this case. Thus, in any case, the test signal has the reference frequency which is fixed, also when a detuning operation is to be performed.

However, to achieve the above-described joint detuning of the filter frequencies of the integrator signal filters in dependence upon the correction signal, the control currents applied to the integrator elements of the reference integrator filter are superimposed on switching control currents in the second embodiment. These switching control currents are implemented in such a way that, due to the superposition of the switching control currents on the control currents, a corresponding variation of the control currents is required when the reference integrator filter is tuned to the reference frequency, in order that the reference integrator filter is tuned, as before, to the reference frequency. The superposition of the control currents applied to the reference integrator filter on the switching control currents thus results in a variation of the control currents when the filter must be tuned, as before, to the reference frequency. Then, there is also a corresponding variation of the value of the correction signal. Since the control currents applied to the integrator elements of the integrator signal filters are derived from this correction signal, their frequencies are varied in dependence upon this variation of the correction signal. Thus, these switching control currents are to be implemented for the second embodiment of the invention in such a way that the correction signal variation caused by these currents leads to the desired detuning of the filter frequencies of the integrator signal filters.

Also in the second embodiment, the occurring variation of the correction signal leads to a corresponding detuning of the filter frequencies of the integrator signal filters, which is jointly effected for all integrator signal filters.

The above-mentioned advantages of the first embodiment also apply in an unlimited way to the second embodiment in which only the variation of the correction signal at a desired detuning is effected in a different way.

A modification which can be used advantageously for both embodiments of the invention provides circuit elements by means of which the correction signal can be generated in a simple manner.

A further modification provides an advantageous implementation of the reference integrator filter for both embodiments of the invention, in which the phase shift of the output signal of this filter can be measured in a relatively simple manner.

The further modification of the invention relate to both embodiments and provide advantageous ranges of application of the integrator-filter circuit according to the invention. In these ranges of application, a plurality of integrator signal filters is to be provided which are to be jointly varied by the detuning value. In all these cases, the integrator-filter circuit according to the invention yields a considerable reduction of the number of components because the integrator signal filters to be used are generally of a higher order or because a plurality of series-arranged integrator signal filters of at least a second order is provided.

These and other aspects of the invention are apparent from and will be elucidated with reference to the embodiments described hereinafter.

DESCRIPTION OF THE PREFERRED EMBODIMENTS

Figure 1:
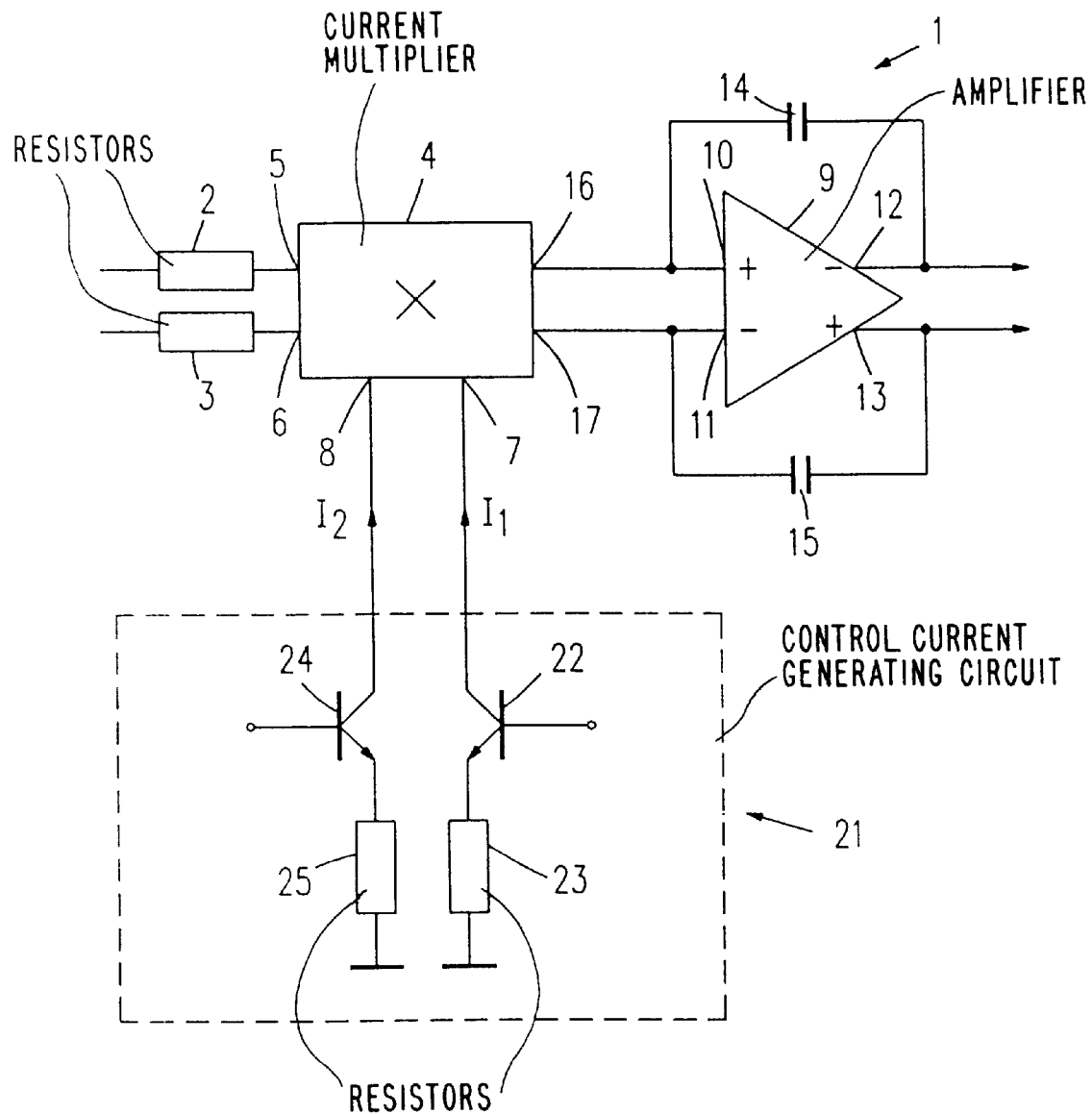
FIG. 1 shows an integrator element provided both for the reference integrator filter and for the reference signal filters, and a circuit arrangement for generating the control currents within the reference integrator filter.

An integrator element 1 shown in FIG. 1 is to be provided in the same technical construction, both in the reference integrator filter and in the integrator signal filters of the integrator-filter circuit according to the invention. An integrator filter generally comprises a plurality of integrator elements 1 which are connected in different ways. For example, the integrator signal filters and the reference integrator filter may be connected in different ways. It is, however, essential that the integrator elements 1 in both filter types are constructed in the same way, i.e., in an identical technique. Such a structure of an integrator element 1 is shown in greater detail in FIG. 1.

The integrator element 1, whose input receives a push-pull signal, comprises resistors 2 and 3 at the input for both signal elements. The output signals of the resistors 2 and 3 are applied to inputs 5 and 6 of a current multiplier 4 which is also referred to as a Gilbert multiplier. The current multiplier 4 has control inputs 7 and 8 to which control currents $I_1$ and $I_2$ are applied. The output signals of the current multiplier 4, which are available at outputs 16 and 17, are applied to inputs 10 and 11 of a push-pull amplifier 9; having a non-inverting input 10 and an inverting input 11. The push-pull amplifier 9 has an inverting output 12 and a non-inverting output 13. The output signal from the inverting output 12 is fed back to the non-inverting input via a capacitance 14. In a corresponding manner, the output signal from the non-inverting output 13 is coupled to the inverting input 11 via a capacitance 15. The outputs 12 and 13 also supply the push-pull output signals of the integrator element 1.

A variation of the integration time constants of the integrator element 1 is possible by means of a variation of the control currents $I_1$ and $I_2$. By varying these currents, the impedance at the input of the push-pull amplifier is varied so that the integration time constant, which is dependent on the values of the resistors 2 and 3 as well as the capacitances 14 and 15, changes due to the varying influence of the resistors 2 and 3.

FIG. 1 also shows a circuit 21 for generating the control currents $I_1$ and $I_2$ as may be advantageously provided within the integrator signal filters of the integrator-filter circuit according to the invention. In this circuit, a voltage value is applied to the base of a transistor 22 whose emitter is coupled to ground via a resistor 23 and the collector supplies the control current $I_1$ which varies in dependence upon the base voltage of the transistor 22. In a corresponding manner, the second control current $I_2$ is generated by means of a transistor 24 and a resistor 25.

Figure 2:
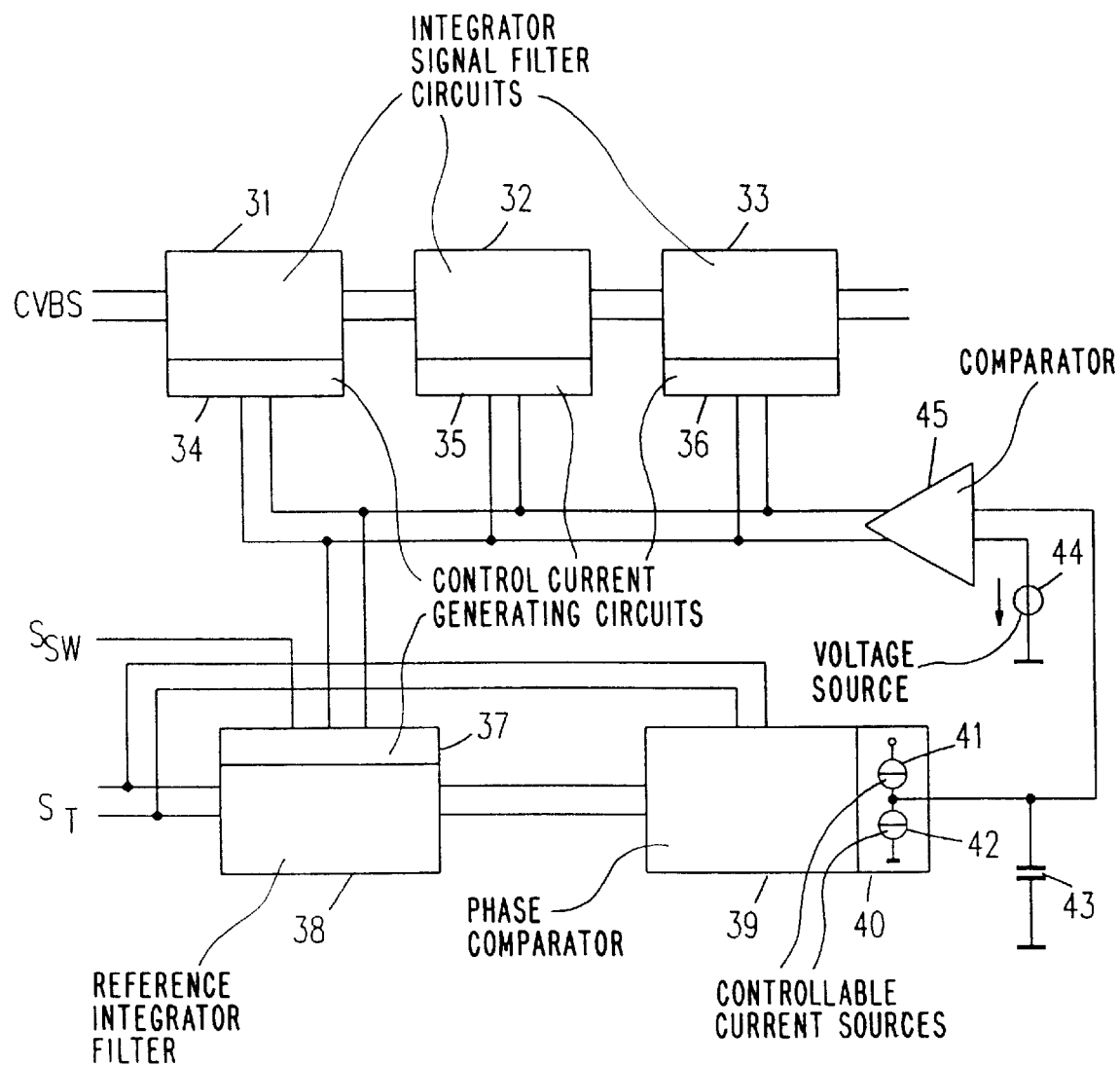
FIG. 2 is a block diagram of the overall integrator-filter circuit according to the invention.

FIG. 2 is a block diagram of an integrator-filter circuit according to the invention. In this embodiment, the integrator-filter circuit comprises three integrator signal filters 31, 32 and 33 which are arranged in series and which are at least of the second order, thus comprising at least two integrator elements 1 as shown in FIG. 1. The mutual connections of the integrator elements may vary.

A video signal which comprises, for example, two sound carriers of different frequencies on which the sound signals are modulated is applied to the input of the first integrator signal filter 31. The integrator signal filters 31, 32 and 33 are used to suppress these sound carrier frequencies as satisfactorily as possible. The filter frequencies of the integrator signal filters should be adjustable at these frequencies. Since the sound carrier frequencies may vary in dependence upon the transmission standard, the filter frequencies of the integrator signal filters 31 to 33 should also be adjustable accordingly.

To this end, circuits 34, 35 and 36 shown in the Figure are used, which comprise circuits 21 as shown in FIG. 1 and are used for generating the control currents for the integrator elements of the integrator signal filters 31, 32 and 33.

The integrator-filter circuit of FIG. 2 also comprises a reference integrator filter 38 whose input receives a push-pull test signal $S_T$. The reference integrator filter 38 also comprises integrator elements 1 as shown in FIG. 1. It is essential that the integrator elements 1 are constructed in the same way as the integrator elements of the signal filter circuits 31, 32 and 33, i.e., the integrator filters must be constructed in the same way but may be connected differently with respect to each other for achieving the filter effect.

The reference integrator filter 38 may be advantageously implemented as a second-order low-pass filter which, when tuned to the frequency of the test signal $S_T$ applied thereto, supplies this signal in an attenuated and 90° shifted phase at its outputs.

Furthermore, a phase comparator 39 is provided which receives the output signal from the reference integrator filter 38 and the test signal $S_T$. Dependent on the phase shift of these two signals, the phase comparator controls two controllable current sources 41 and 42 incorporated in a signal-generating circuit 40. Dependent on the sign of the phase deviation of the two signals applied to the phase comparator, either the current source 41 or the current source 42 is activated. The period of activation depends on the extent of the phase shift. A capacitance 43 is connected to the coupling point of the two current sources 41 and 42 and the other terminal of this capacitance is coupled to a reference potential.

By means of the current sources 41 and 42, the charge of the capacitance 43 is varied accordingly, in dependence upon the relative phase shift of the two signals applied to the phase comparator 39.

The voltage drop occurring across the capacitance 43 is compared, by means of a comparator 45, with a reference voltage which is generated by means of a voltage source 44. The output of the comparator 45 supplies a correction signal which is applied to the circuits 34, 35 and 36 of the integrator signal filters 31, 32 and 33 for generating the control currents. The correction signal is further applied to a circuit 37 of the reference integrator filter, to this circuit generating the control currents for the integrator elements of the reference integrator filter 38.

The circuit shown in FIG. 2 is usable both for an integrator-filter circuit in accordance with the first embodiment of the invention and for such a circuit in accordance with the second embodiment of the invention, with slight variations. These two embodiments will hereinafter be elucidated separately.

In accordance with the first embodiment, the frequencies of the signal filters are tuned in dependence upon the frequency of the test signal.

If the test signal $S_T$ applied to the reference integrator filter 38 has a reference frequency which represents a known frequency, the phase of this signal is shifted by a value by the reference integrator filter 38. The height of this value is dependent on 30 whether the reference integrator filter is tuned to the frequency of the test signal $S_T$. If this is the case, the phase of the output signal of the reference integrator filter 38 is shifted by 90° with respect to the phase of the test signal $S_T$.

The phase comparator controls the current sources 41 and 42 in dependence upon the mutual phase relation of these two signals. Dependent on the thus varying charge of the capacitance 43, the comparator 45 supplies a correction signal.

Dependent on this correction signal, the tuning of the reference integrator filter 38 is varied by corresponding variation of the control currents by means of the circuit 37. The circuit is implemented in such a way that, due to the variation of the correction signal in dependence upon the phase shift of the test signal $S_T$ and the output signal of the reference integrator filter 38, the reference integrator filter 38 is tuned in such a way that it is tuned to the frequency of the test signal. The output signal of the reference integrator filter 38 then has a phase shift of 90 degrees with respect to the test signal $S_T$. In this state, the correction signal supplied by the comparator 35 has a value which causes a corresponding generation of the 10 control currents within the circuits 34, 35 and 36 of the signal integrator filters 31, 32 and 33, at which these filters are exactly tuned to their rated frequencies. For example, the signal filter 31 may thus be tuned to a frequency of 4.5 MHz and the signal filters 32 and 33 may be tuned to a frequency of 4.75 MHz.

As long as the frequency of the test signal $S_T$ has the constant value of the reference frequency, the readjustment of tuning the integrator filter 38 will always work in such a way that the reference integrator filter is tuned to the frequency of this input signal. The correction signal derived by means of the comparator maintains the filter frequencies of the integrator signal filters 31, 32 and 33 at their rated frequencies.

However, if the filter frequencies of the signal filters 31, 32 and 33 must be changed for tuning to different sound carrier frequencies, for example, if tuning to 5.5 and 5.75 MHz instead of to 4.5 and 4.75 MHz must take place, then the frequency of the test signal $S_T$ is varied in a corresponding manner. In this example, the signal filters must be tuned to frequencies which are above their rated frequencies by a detuning value of +1.0 MHz. To this end, the frequency of the test signal $S_T$ applied to the reference integrator filter 38 is also changed by this detuning value of +1.0 MHz. If the test signal ST had a frequency of, for example, 4 MHz beforehand, it will now be 5.0 MHz. Since the reference integrator filter 38 must be tuned to this new frequency, for which different control currents are required, the circuit comprising the phase comparator 39, the current sources 41 and 42, the capacitance 43 and the comparator 45 will perform a corresponding variation of the correction signal, which results in control currents changed accordingly and generated by means of the circuit 37 for the reference integrator filter 38. If the reference integrator filter 38 is tuned to the changed frequency of the test signal $S_T$, the value of the correction signal has also changed in this steady-state condition. The circuits 34, 35 and 36 thereby generate different, changed control currents for the integrator signal filters 31, 32 and 33 which are thus tuned to different frequencies. The circuit arrangement is implemented in such a way that, in accordance with the detuning of the reference frequency by +1.0 MHz, the signal filter frequencies of the integrator signal filters 31, 32 and 33 are also detuned by this value.

A corresponding variation of the filter frequencies of the integrator signal filters 31, 32 and 33 has thereby been achieved without any additional circuit components.

The circuit arrangement shown in FIG. 2 is also usable for the second embodiment of the invention in which, however, a switching signal $S_{SW}$ is alternatively for varying the filter frequencies of the integrator signal filters 31, 32 and 33.

In this second embodiment, the frequency of the test signal $S_T$ remains constant, i.e., it is always the reference frequency.

As long as no switching signal $S_{SW}$ is applied to the circuit arrangement 37 for generating the control currents for the reference integrator filter 38, the details as described above with reference to the first embodiment apply. The reference integrator filter 38 is tuned to the reference frequency of the test signal $S_T$, and the integrator signal filters 31, 32 and 33 are tuned to their rated frequencies.

For varying the filter frequencies of the integrator signal filters 31, 32 and 33, the switching signal Ssw is used in this second embodiment of the invention. Switching control currents which, within the circuit 37, are superimposed on the control currents for the integrator elements of the reference integrator filter 38, are derived from the switching signal $S_{SW}$. Due to this superposition on the control currents, there is a change of the tuning frequency of the reference integrator filter 38. This also results in a change of the phase shift of the output signal of the reference integrator filter 38 with respect to the test signal $S_T$, so that the phase comparator 39 controls the current sources 41 and 42 in a correspondingly changed manner. As a result, the correction signal supplied by the comparator 45 is also varied, so that the control currents generated within the circuit 37 for the reference integrator filter are also varied. This is effected in such a way that, due to the readjustment, the reference integrator filter 38 is finally tuned to the reference frequency of the test signal $S_T$ again, despite the switching currents superimposed on the control currents. The control currents applied to the integrators of the reference filter are the same again. The result is, however, that the value of the correction signal supplied by the comparator 45 has changed so that there is also a corresponding variation of the generated control currents in the circuits 34, 35 and 36 for generating the control currents for the integrator elements in the integrator signal filters 31, 32 and 33. The integrator signal filters 31, 32 and 33 are tuned to frequencies which have changed accordingly.

Dependent on the switching signal $S_{SW}$, the tuning frequencies of the integrator signal filters 31, 32 and 33 can thus be varied in a simple manner. Alternatively, a plurality of switching signals may be provided with which different detuning values can be achieved.

Figure 3:
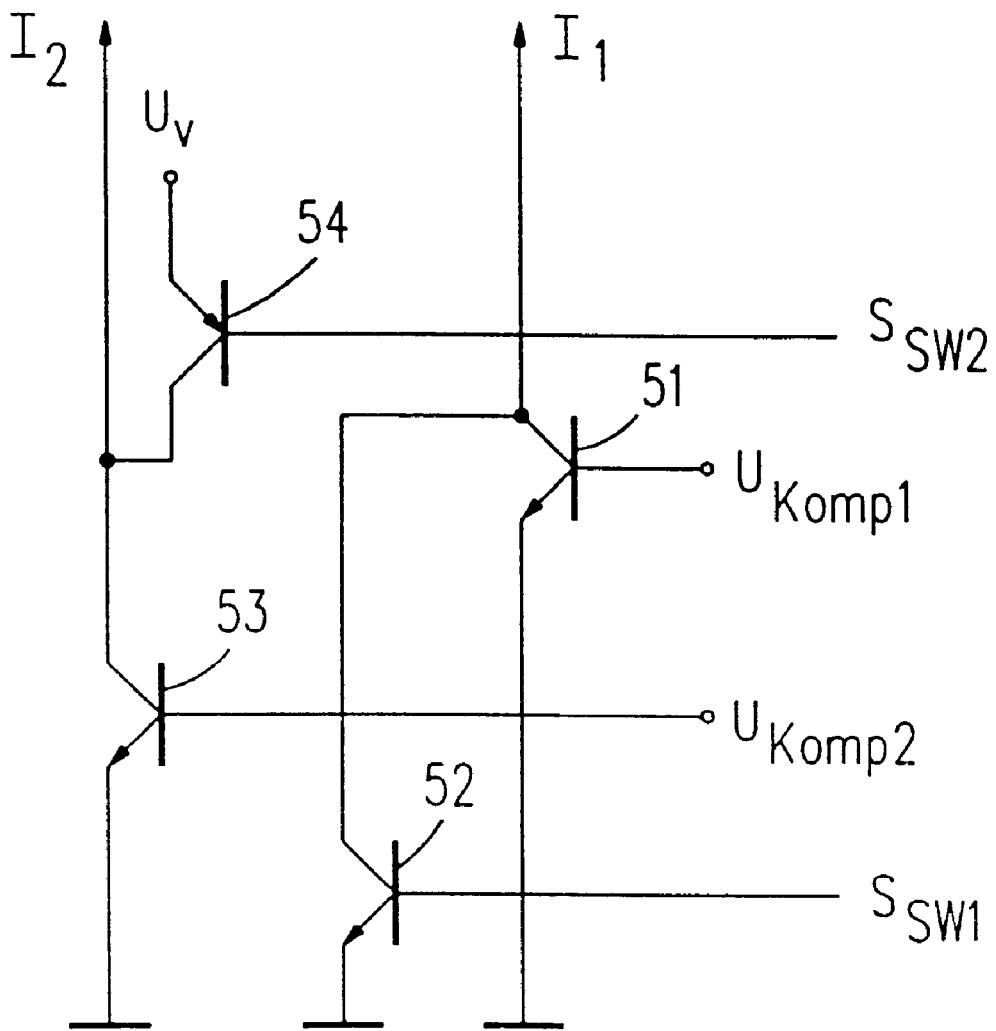
FIG. 3 shows a circuit arrangement for generating the control currents for the integrator elements of the reference integrator filter in accordance with the second embodiment of the invention.

FIG. 3 shows an advantageous embodiment of the circuit 37 used for generating the control currents for the reference integrator filter 38 of FIG. 2.

FIG. 3 shows an NPN transistor 51 whose base receives a first signal $U_{komp1}$ of the push-pull correction signal as supplied by the comparator 45 of FIG. 2.

The emitter of transistor 51 is coupled to a reference potential. Its collector supplies a first control current $I_1$.

The circuit shown in FIG. 3 also comprises a further NPN transistor 53 whose base receives the second signal $U_{komp2}$ of the push-pull correction signal. The collector of the transistor 53 supplies the second control signal $I_2$.

The control signals $I_1$ and $I_2$ are applied to the integrator elements within the reference integrator filter 38 of FIG. 2.

Dependent on the components $U_{komp1}$ and $U_{komp2}$ of the push-pull correction signal, the control currents $I_1$ and $I_2$ are generated for tuning the frequency of the reference integrator filter 38 of FIG. 2.

However, in the second embodiment of the invention, explained hereinbefore with reference to FIG. 2, an additional switching signal $S_{SW}$ is provided which effects the corresponding detuning of the filter frequencies of the signal integrator filters 31, 32 and 33 of FIG. 2.

Within the circuit shown in FIG. 3, a switching signal $S_{SW1}$, which may be derived from the switching signal $S_{SW}$ or may also directly represent this signal, is applied to the base of an NPN transistor 52 whose emitter is coupled to reference potential and whose collector is coupled to the collector of the transistor 51. When the switching signal $S_{SW}$ is activated, the collector current of the transistor 52 is additionally superimposed on the control current $I_1$, in this case with equal sign.

The circuit arrangement shown in FIG. 3 also comprises a PNP transistor 54 whose base receives the switching signal $S_{SW2}$ which may be derived from the switching signal $S_{SW}$ or may directly represent this signal. The emitter of the transistor 54 is coupled to a power supply potential $U_V$ and the collector of the transistor 54 is coupled to the collector of the transistor 53. When the switching signal $S_{SW}$ is activated, the collector current of the transistor 54 is superimposed on the second control current $I_2$, in this case with opposite sign.

Within the circuit arrangement of FIG. 3, the collector currents of the transistors 52 and 54 are thus superimposed with mutually different signs on the control currents $I_1$ and $I_2$ when the switching signal $S_{SW}$ is activated. The above-described effect for readjusting the tuning of the reference integrator filter 38 within the circuit arrangement of FIG. 2 is thereby achieved in the second embodiment of the invention.

A plurality of different switching control currents may be provided, each causing a different detuning of the signal filter frequencies. In that case, further transistors corresponding to transistors 52 and 54 should be provided in the circuit arrangement shown in FIG. 3.

What is claimed is:

1. An integrator-filter circuit for filtering a push-pull signal by means of at least two integrator signal filters comprising integrator elements having filter frequencies adjustable by control currents applied to the integrator elements, characterized in that the integrator-filter circuit comprises a reference integrator filter having at least two further integrator elements constructed in an identical technique as the integrator elements in the at least two integrator signal filters, said reference integrator filter, when tuned to a frequency of a test signal applied thereto, shifting the phase of said test signal by a defined value, and being arranged subsequent to a phase comparator also receiving the test signal, a correction signal being derived from the output signal of the phase comparator, the control currents, applied to the further integrator elements of the reference integrator filter and to the integrator elements of the integrator signal filters, being generated in dependence on said correction signal, wherein, in response to the control currents, the reference integrator filter is tuned to the frequency of the test signal applied thereto, wherein the integrator signal filters are tuned to rated frequencies in dependence upon the correction signal when the reference integrator filter is tuned to a reference frequency test signal applied thereto, and wherein, for tuning the integrator signal filters to filter frequencies deviating by a predetermined value from the rated frequencies, a test signal deviating by the predetermined value from the reference frequency is applied to the reference integrator filter which is tuned to said test signal.

2. An integrator-filter circuit for filtering a push-pull signal by means of at least two integrator signal filters comprising integrator elements having filter frequencies adjustable by control currents applied to the integrator elements, characterized in that the integrator-filter circuit comprises a reference integrator filter having at least two further integrator elements constructed in an identical technique as the integrator elements in the at least two integrator signal filters, said reference integrator filter, when tuned to a frequency of a test signal applied thereto, shifting the phase of said test signal by a defined value, and being arranged subsequent to a phase comparator also receiving the test signal, wherein a correction signal is derived from the output signal of the phase comparator (39), the control currents, applied to the further integrator elements of the reference integrator filter and to the integrator elements of the integrator signal filters, being generated in dependence on the correction signal, wherein the reference integrator filter is tuned to the frequency of the test signal applied thereto in response to the control currents, wherein the integrator signal filters are tuned to rated frequencies in dependence upon the correction signal when the reference integrator filter is tuned exclusively by the two control currents to a reference frequency test signal applied thereto, and wherein, for tuning the integrator signal filters (31, 32, 33) at filter frequencies deviating by a predetermined value from the rated frequencies, at least a switching control current is superimposed on the control currents applied to the reference integrator filter, this switching control current being dimensioned such that, when tuning the reference integrator filter to the test signal by the correction signal, this test signal causes the integrator signal filters to tune to frequencies which deviate by the predetermined value from their rated frequencies.

3. An integrator-filter circuit as claimed in claim 1, characterized in that said integrator-filter circuit further comprises two current sources having respective outputs coupled to a capacitor, and a comparator having a first input for receiving a voltage across the capacitor and a second input for receiving a reference voltage, wherein, in dependence on the output signal of the phase comparator, said two current sources are controlled to charge or discharge said capacitance with currents of different signs, and the comparator includes an output for supplying the correction signal.

4. An integrator-filter circuit as claimed in claim 1, characterized in that the reference integrator filter comprises two integrator elements and is implemented as a second-order low-pass filter which, when tuned to the frequency of the test signal, shifts its phase by 90 degrees.

5. An integrator-filter circuit as claimed in claim 1, characterized in that the push-pull signal to be filtered is a video signal which comprises sound signals modulated on one or more sound carriers, and in that the integrator signal filters are implemented for filtering the sound carriers.

6. An integrator-filter circuit as claimed in claim 4, characterized in that the integrator signal filters comprise a first, third-order signal filter, a second, second-order signal filter and a third, second-order signal filter.

7. An integrator-filter circuit as claimed in claim 5, characterized in that the first and the second integrator signal filters are implemented for filtering a first sound carrier, and in that the third integrator signal filter is implemented for filtering a second sound carrier having a smaller amplitude than the first sound carrier.

8. An integrator-filter circuit as claimed in claim 1, characterized in that the push-pull signal to be filtered is a video signal comprising chrominance signals modulated on a chrominance subcarrier, and in that the integrator signal filters are implemented for filtering the chrominance subcarrier.

9. An integrator-filter circuit as claimed in claim 2, characterized in that said integrator-filter circuit further comprises two current sources having respective outputs coupled to a capacitor, and a comparator having a first input for receiving a voltage across the capacitor and a second input for receiving a reference voltage, wherein, in dependence on the output signal of the phase comparator, said two current sources are controlled to charge or discharge said capacitance with currents of different signs, and the comparator includes an output for supplying the correction signal.

10. An integrator-filter circuit as claimed in claim 2, characterized in that the reference integrator filter comprises two integrator elements and is implemented as a second-order low-pass filter which, when tuned to the frequency of the test signal, shifts its phase by 90 degrees.

11. An integrator-filter circuit as claimed in claim 2, characterized in that the push-pull signal to be filtered is a video signal which comprises sound signals modulated on one or more sound carriers, and in that the integrator signal filters are implemented for filtering the sound carriers.

12. An integrator-filter circuit as claimed in claim 10, characterized in that the integrator signal filters comprise a first, third-order signal filter, a second, second-order signal filter and a third, second-order signal filter.

13. An integrator-filter circuit as claimed in claim 11, characterized in that the first and the second integrator signal filters are implemented for filtering a first sound carrier, and in that the third integrator signal filter is implemented for filtering a second sound carrier having a smaller amplitude than the first sound carrier.

14. An integrator-filter circuit as claimed in claim 2, characterized in that the push-pull signal to be filtered is a video signal comprising chrominance signals modulated on a chrominance subcarrier, and in that the integrator signal filters are implemented for filtering the chrominance subcarrier.

* * * * *